United States Patent

[11] 3,571,916

[72] Inventor Franz Joseph Landkammer
Woburn, Mass.
[21] Appl. No. 825,475
[22] Filed Mar. 14, 1969
Division of Ser. No. 648,018, June 22, 1967, Pat. No. 3,302,284.
[45] Patented Mar. 23, 1971
[73] Assignee Microwave Associates, Inc.
Burlington, Mass.

[54] SCHOTTKY EDGE CONTACT DIODE
4 Claims, 4 Drawing Figs.

[52] U.S. Cl. 29/578, 29/589
[51] Int. Cl. B01j 17/00, H01l 7/02
[50] Field of Search 29/571, 576, 589, 578, 590, 574, 579; 317/234.31

[56] References Cited
UNITED STATES PATENTS

| | | | |
|---|---|---|---|
| 3,425,879 | 2/1969 | Shaw et al. | 29/578 |
| 3,461,566 | 8/1969 | Gerstner | 29/578 |

*Primary Examiner*—John F. Campbell
*Assistant Examiner*—D.M. Heist
*Attorney*—Alfred H. Rosen

ABSTRACT: A semiconductor diode is disclosed made so that the Schottky barrier junction is applied to the edge of a semiconductor wafer instead of some arbitrary point on its surface. The area, where contact is made to an electrode, is entirely applied to an insulator adjacent to the edge junction. This structure provides large bonding area with small junction area.

FRANZ JOSEPH LANDKAMMER,
Inventor
By [signature] Attorney

FRANZ JOSEPH LANDKAMMER,
Inventor

By [signature]
Attorney

SCHOTTKY EDGE CONTACT DIODE

This is a division of application Ser. No. 648,018 filed on Jun. 22, 1967, now U.S. Pat. No. 3,302,284.

BACKGROUND OF THE INVENTION

The field of this invention is semiconductor diodes for use as microwave mixer and/or detector diodes.

Microwave mixers and/or detectors convert microwave signals to lower frequencies where they can be detected, amplified or otherwise more easily handled. Microwave mixer and/or detector diodes should therefore be good rectifiers at high frequencies. Their static DC characteristic should, therefore, for an ideal rectifier, exhibit an infinite conductance at a small forward voltage. Another requirement is that rectification be a majority carrier phenomen—i.e., a noninjecting rectifying junction—so that frequency is not carrier lifetime dependent. Still another requirement is that the series resistance (*Rs*) and capacitance (*C*), whose product gives the time constant must be kept at a minimum to reduce signal loss and noise contribution from thermal noise. This latter requirement and the previous one implies that frequency response of the diode is limited only by the time constant or RC charging time rather than the majority carrier lifetime up to the dielectric relaxation frequency of the semiconductor. To be an effective rectifier at the signal frequency, the time varying conductance of the diode must be relatively large compared to the susceptance of the diode at the signal frequency. This requirement puts a severe limitation on the total capacitance that may be used in high frequency mixer diodes. In order to allow for their use in high frequency bands it is also necessary to reduce the so called barrier capacitance to a minimum, because it represents a bypass for high frequency signals and so causes a low detection or conversion efficiency. The reduction of barrier capacitance can be maintained by the reduction of the physical junction area of the Schottky barrier diode. Therefore one of the most important problems of fabricating effective Schottky barrier diodes for high frequency application consists in making intimate small area contacts of metal and semiconductor either by evaporating or electroplating the metal onto the semiconductor. However, this requirement is diametrically opposed to the requirement of making electrical contact to these small junctions. The need for making electrical contact to the junction which will stand mechanical shock and thermal stresses requires that the contact area to relatively large.

How to balance these two needs and obtain an extremely small junction area and a low barrier capacitance and yet provide a sufficiently large electrode bonding area is the subject of this invention.

Prior art devices having small area diodes are generally fabricated using the well-known photoresist technique. A schematic picture of this type of diode is shown in FIG. 1. It consists of an oxide layer 3, deposited on the epitaxial semiconductor layer 2, which itself has been grown on a lower resistivity semiconductor substrate 1.

The Schottky junction 4 consists of plated or evaporated metal, such as nickel, through the oxide opening 7.

The junction is electrically connected to a larger metal button 5, which is used to make contact with an electrode. This structure allows junction areas of not less than 1 micron because of optical reduction limitations of equipment used in making a hole through the oxide. Although this junction area size is small enough for general applications, special high frequency problems require smaller junction areas. However, the contact area of the metal mushroom button 5 should be quite large in order to obtain good bonding to the electrode. Because the button separated from the semiconductor by a dielectric forms a parasitic capacitance over and above the barrier capacitance, a structure of this nature requires that the metal button be limited in area and diameter. Hence, the diameter B of the button may not exceed .0007 inch, in order to limit parasitic capacitance to less than .01 pf. A device with such a small contact area is fragile and unstable.

The Schottky edge contact diode disclosed herewith overcomes these problems.

SUMMARY OF THE INVENTION

This invention relates in general to the formation of metal-semiconductor rectifying junction, and in particular to the formation of extremely small area metal-semiconductor rectifying junctions, such junctions electrically connected to large area ohmic contacts in such manner so that parasitic capacitance is kept to a minimum value.

It is an object of this invention to make such diodes using prior existing diode-fabrication techniques and processes, and in forms and shapes already known to the art and related industries.

It is another general object of this invention to provide novel Schottky edge contact diodes.

DESCRIPTION OF THE INVENTION

Exemplary embodiments of the invention, and methods to make them, are described with reference to the accompanying drawings, in which.

Figure 1:
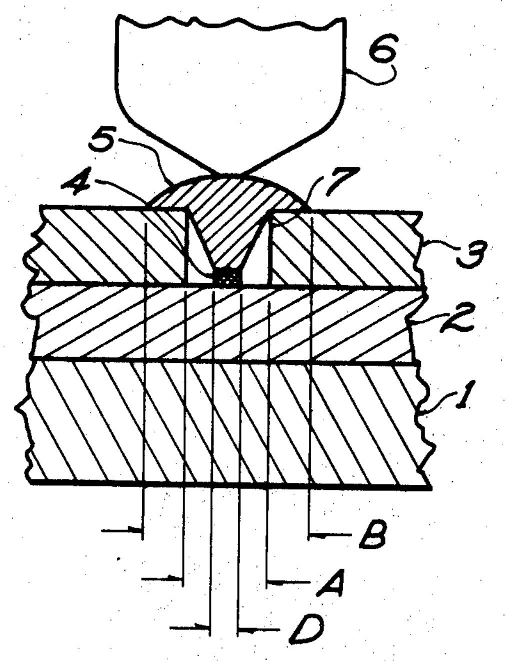
FIG. 1 illustrates a diode made according to a prior art method.
Figure 2:
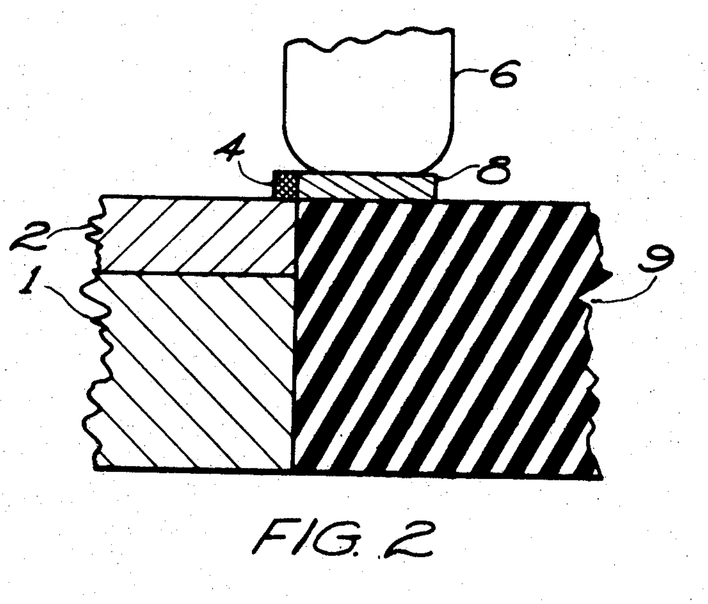
FIG. 2 illustrates schematically the essential elements of a diode according to the invention.

Referring to FIG. 2, a semiconductor body composed of semiconductor substrate 1, and semiconductor epitaxial layer 2 is cemented to an insulator 9, along one edge. The metal-semiconductor junction 4 is formed on the edge of the semiconductor body, while the large ohmic contact 8, which is electrically connected to the metal-semiconductor junction is formed entirely on the insulator 9, An electrode 6 is bonded to the ohmic contact 8. The electrode may be any suitable conductor of wire, mesh or ribbon form.

Figure 3:
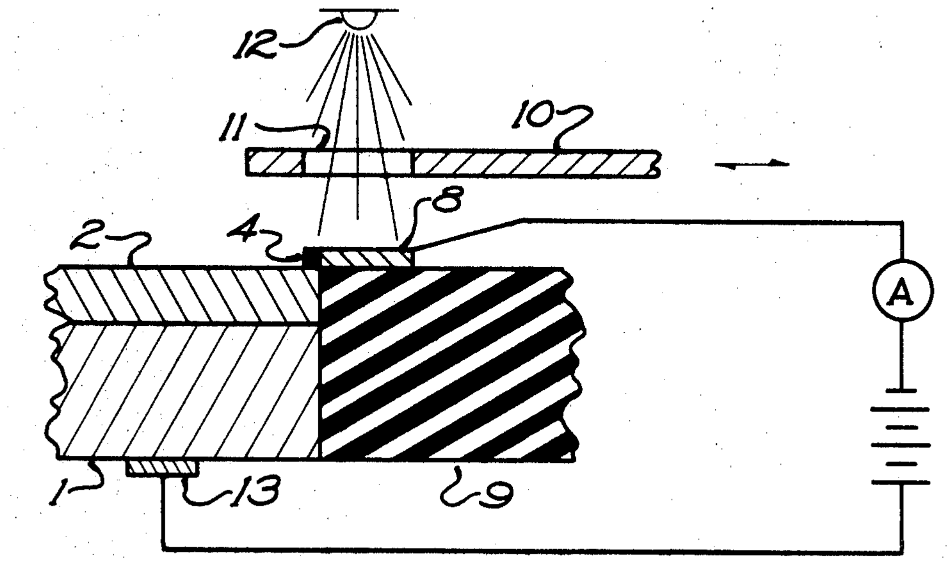
FIG. 3 illustrates one method of fabricating the metal-semiconductor rectifying junction and ohmic contact.
Figure 4:
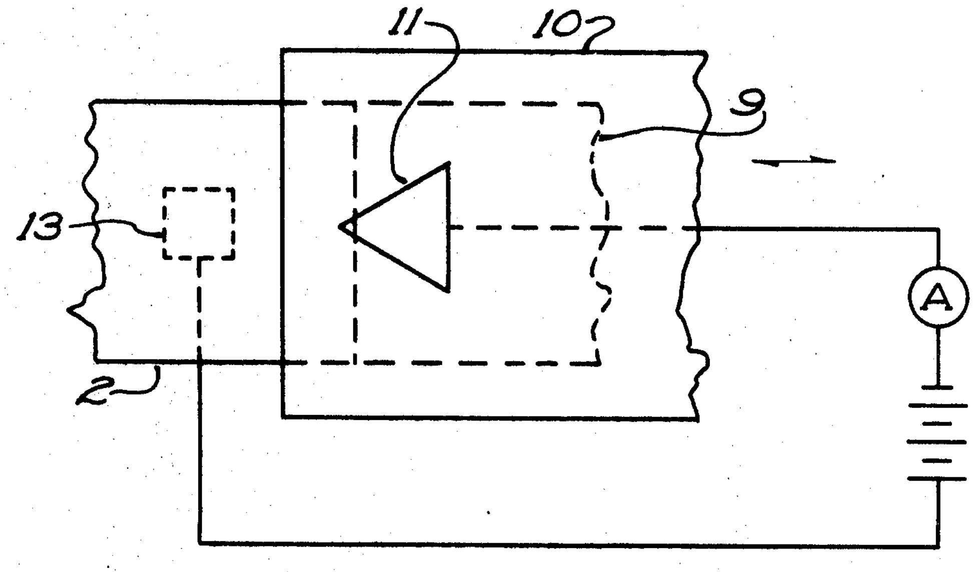
FIG. 4 is a plan view of FIG. 3.

FIGS. 3 and 4 illustrate one method of making this invention. A mask 10, with a triangular opening 11, is slideably disposed over the joined semiconductor body and insulator 9, so that the triangular opening exposes only the insulator beneath. A metal is evaporated in evaporating source 12, and the mask is moved along the surface of the semiconductor body and insulator so that the apex of the triangle approaches the edge of the semiconductor body first. As the apex reaches the semiconductor body a very small amount of metal is evaporated through the apex onto the semiconductor body. At this point a junction is formed which completes the electrical circuit and activates a meter to signal the stopping of the movement of the mask. The resulting junction is extremely small, and the contact area is large, yielding a diode with extremely small barrier capacitance, and also extremely small parasitic capacitance but with a large contact area. The resulting diode is extremely rugged and has superior properties for use as a mixer and or detector diode at high frequencies.

I claim:

1. A method of fabricating a Schottky edge contact diode which comprises:

growing a thin semiconductor epitaxial layer upon a semiconductor substrate;

cementing an electrical insulator edge to edge with the semiconductor substrate and having their exposed surfaces flush with each other;

masking the cemented surface of the semiconductor and electrical insulator with a mask having a triangular opening and so disposed on the surface of the semiconductor and electrical insulator so that the triangular opening exposes only the electrical insulator below;

evaporating metal through the triangular opening in the mask;

slideably moving the mask along the surface of the semiconductor and electrical insulator with one apex of the triangular opening approaching the semiconductor until a very small amount of evaporated metal is deposited through the apex on the semiconductor surface;

detecting the deposition of metal on the semiconductor surface; and bonding an electrode on the triangular metal contact.

2. A method of fabricating a Schottky edge contact diode as recited in claim 1 wherein the evaporated metal is selected from the group consisting of nickel, gold, platinum, tungsten, tantalum, copper, magnesium and calcium.

3. A method of fabricating a SChottky edge contact diode as recited in claim 1 wherein the semiconductor is selected from the group consisting of silicon, germanium, gallium arsenide and indium antimonide.

4. A method of fabricating a Schottky edge contact diode as recited in claim 1, wherein the bonding of an electrode to the triangular metal contact is performed by thermocompression bonding.